(12) United States Patent
Takeda

(10) Patent No.: US 10,892,079 B2
(45) Date of Patent: Jan. 12, 2021

(54) MULTILAYER COIL COMPONENT

(71) Applicant: Murata Manufacturing Co., Ltd., Kyoto-fu (JP)

(72) Inventor: Yasushi Takeda, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 244 days.

(21) Appl. No.: 16/209,839

(22) Filed: Dec. 4, 2018

(65) Prior Publication Data
US 2019/0180903 A1    Jun. 13, 2019

(30) Foreign Application Priority Data

Dec. 7, 2017 (JP) .................................. 2017-235381

(51) Int. Cl.
| | | |
|---|---|---|
| H01F 27/28 | (2006.01) | |
| H01F 17/00 | (2006.01) | |
| H05K 1/16 | (2006.01) | |
| H01F 5/00 | (2006.01) | |

(52) U.S. Cl.
CPC ......... *H01F 17/0013* (2013.01); *H01F 5/003* (2013.01); *H01F 27/28* (2013.01); *H01F 27/2804* (2013.01); *H01F 27/2847* (2013.01); *H05K 1/165* (2013.01); *H01F 2027/2809* (2013.01)

(58) Field of Classification Search
CPC ............. H01F 17/0013; H01F 27/2804; H01F 27/2847; H01F 5/003; H01F 2027/2809; H01F 41/043; H01F 27/28; H05K 1/165
See application file for complete search history.

(56) References Cited

U.S. PATENT DOCUMENTS

| | | | | |
|---|---|---|---|---|
| 2010/0194513 A1* | 8/2010 | Ozawa | ................... | H05K 1/165 336/200 |
| 2013/0234285 A1* | 9/2013 | Hijioka | ................... | H01L 28/10 257/531 |
| 2015/0014042 A1* | 1/2015 | Noguchi | ................ | H05K 1/165 174/262 |

FOREIGN PATENT DOCUMENTS

| | | |
|---|---|---|
| JP | H02-202007 A | 8/1990 |
| JP | 2009-176836 A | 8/2009 |
| JP | 2017-028143 A | 2/2017 |

* cited by examiner

*Primary Examiner* — Tuyen T Nguyen
(74) *Attorney, Agent, or Firm* — Studebaker & Brackett PC

(57) ABSTRACT

A multilayer coil component includes an element body; and a coil that is provided inside the element body and includes a plurality of coil conductors that are stacked in a stacking direction and are electrically connected to each other. Each coil conductor has a contact portion and a non-contact portion. A pair of the contact portions that are adjacent to each other in the stacking direction and contact each other form a contact region. In the coil, all the contact regions are located at different positions from each other when viewed in the stacking direction. The number of turns of the coil is represented by n (positive number). The number of stacked coil conductor layers is given by 2n+1.

20 Claims, 15 Drawing Sheets

MULTILAYER COIL COMPONENT

CROSS-REFERENCE TO RELATED APPLICATION

This application claims benefit of priority to Japanese Patent Application No. 2017-235381, filed Dec. 7, 2017, the entire content of which is incorporated herein by reference.

BACKGROUND

Technical Field

The present disclosure relates to a multilayer coil component.

Background Art

Japanese Unexamined Patent Application Publication No. 2017-28143 discloses a multilayer coil component of the related art. The multilayer coil component includes an element body and a coil that is provided inside the element body. The coil has a plurality of coil portions and a plurality of connection portions, and the coil portions and the connection portions are stacked in a stacking direction and connected to one another. In other words, the plurality of coil portions and the plurality of connection portions are coil-forming layers that form the coil.

In the multilayer coil component of the related art, when the number of turns of the coil is 2, four coil portion layers and two connection portion layers, that is, a total of six coil-forming layers are required. As the number of coil-forming layers increases, the coil length increases, and there is a risk of the direct-current resistance value (Rdc) of the multilayer coil component becoming large, and furthermore, the height of the multilayer coil component in the stacking direction increases and it is difficult to realize a low profile for the multilayer coil component.

SUMMARY

Accordingly, a multilayer coil component of a preferred embodiment of the present disclosure includes an element body; and a coil that is provided inside the element body and includes a plurality of coil conductors that are stacked in a stacking direction and are electrically connected to each other. The coil conductors each have a contact portion that is a part of the coil conductor that contacts another coil conductor that is adjacent thereto in the stacking direction. A non-contact portion that is a part of the coil conductor that does not contact another coil conductor that is adjacent thereto in the stacking direction.

The respective contact portions of the coil conductors that are adjacent to each other in the stacking direction contact each other and are connected to each other. Contact regions, which are formed as a result of the contact portions contacting each other, are all located at different positions from each other when viewed in the stacking direction, and n (positive number) represents the number of turns of the coil and the number of stacked layers of the coil conductors is given by 2n+1.

According to the multilayer coil component, all of the contact regions in the coil are located at different positions from each other when the coil is viewed in the stacking direction, n (positive number) represents the number of turns of the coil, and the number of stacked coil conductor layers is given by 2n+1, and therefore the number of stacked coil conductor layers can be reduced. Therefore, the coil length can be reduced and the direct-current resistance value of the multilayer coil component can be reduced, and the height of the multilayer coil component in the stacking direction can be reduced and a low profile can be realized for the multilayer coil component.

In the multilayer coil component according to the preferred embodiment, a thickness of the non-contact portion of at least one coil conductor among the plurality of coil conductors may be larger than a thickness of the non-contact portion of another coil conductor. According to this embodiment, the cross-sectional area of at least one coil conductor can be increased and the direct-current resistance value can be reduced.

In the multilayer coil component according to the preferred embodiment, in at least one coil conductor among the plurality of coil conductors, a length of the contact portion may be larger than a length of the non-contact portion. According to this embodiment, the contact area between adjacent coil conductors can be increased, and the direct-current resistance value can be further reduced.

In the multilayer coil component according to the preferred embodiment, in at least one coil conductor among the plurality of coil conductors, a width of the non-contact portion may be larger than a width of the contact portion. According to this embodiment, the cross-sectional area of the non-contact portion can be increased and the direct-current resistance value can be further reduced.

In the multilayer coil component according to the preferred embodiment, the coil may have a substantially rectangular shape when viewed in the stacking direction, and the respective non-contact portions of the plurality of coil conductors may be positioned at one side of the coil when the coil is viewed in the stacking direction. According to this embodiment, large-width non-contact portions can be arranged so as to be concentrated at one side of the coil, and the inductance (L) can be further increased without reducing the area of the inner-diameter part of the coil.

In the multilayer coil component according to the preferred embodiment, the coil may have a substantially rectangular shape when viewed in the stacking direction, and the respective non-contact portions of the plurality of coil conductors may be positioned at a short side of the coil when the coil is viewed in the stacking direction. According to this embodiment, the inner-diameter part of the coil may be substantially square shaped or close to a square shape, and therefore the inductance can be further increased.

In the multilayer coil component according to the preferred embodiment, the plurality of coil conductors may have different shapes from each other. In this embodiment, design changes can be made without degrading the characteristics of the coil.

In the multilayer coil component according to the preferred embodiment, the number of turns n of the coil conductors is 2. According to a multilayer coil component of a preferred embodiment of the present disclosure, the direct-current resistance value can be reduced. In addition, a low profile can be realized.

Other features, elements, characteristics and advantages of the present disclosure will become more apparent from the following detailed description of preferred embodiments of the present disclosure with reference to the attached drawings.

DETAILED DESCRIPTION

Hereafter, the present disclosure will be described in detail on the basis of illustrative embodiments.

First Embodiment

Figure 1:
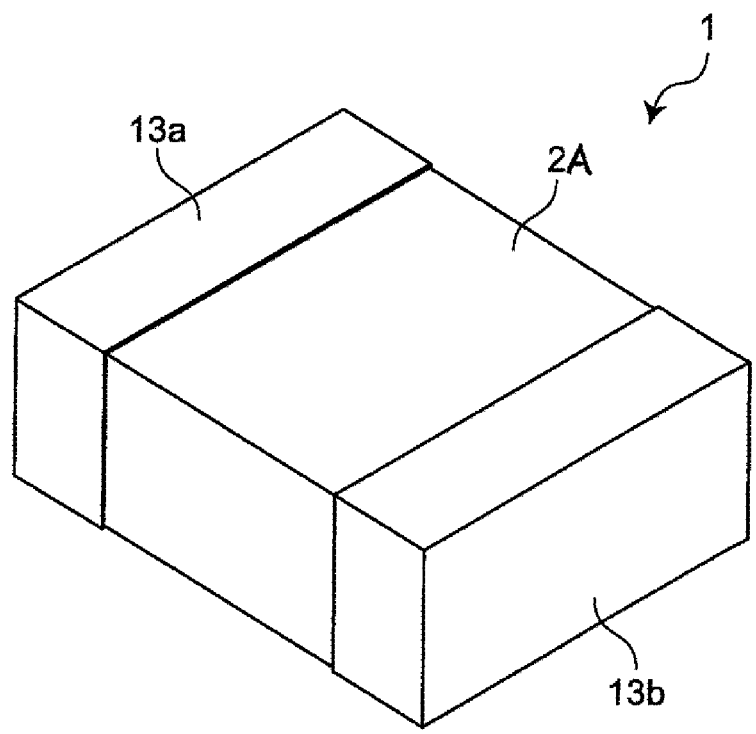
FIG. 1 is a schematic perspective view illustrating the exterior of a multilayer coil component of a first embodiment.

FIG. 1 is a schematic perspective view illustrating the exterior of a multilayer coil component of a first embodiment. A multilayer coil component 1 includes an element body 2A, a coil 3 (not illustrated in FIG. 1) that is provided inside the element body 2A, and a first outer electrode 13a and a second outer electrode 13b that are provided on the outside of the element body 2A.

Figure 2:
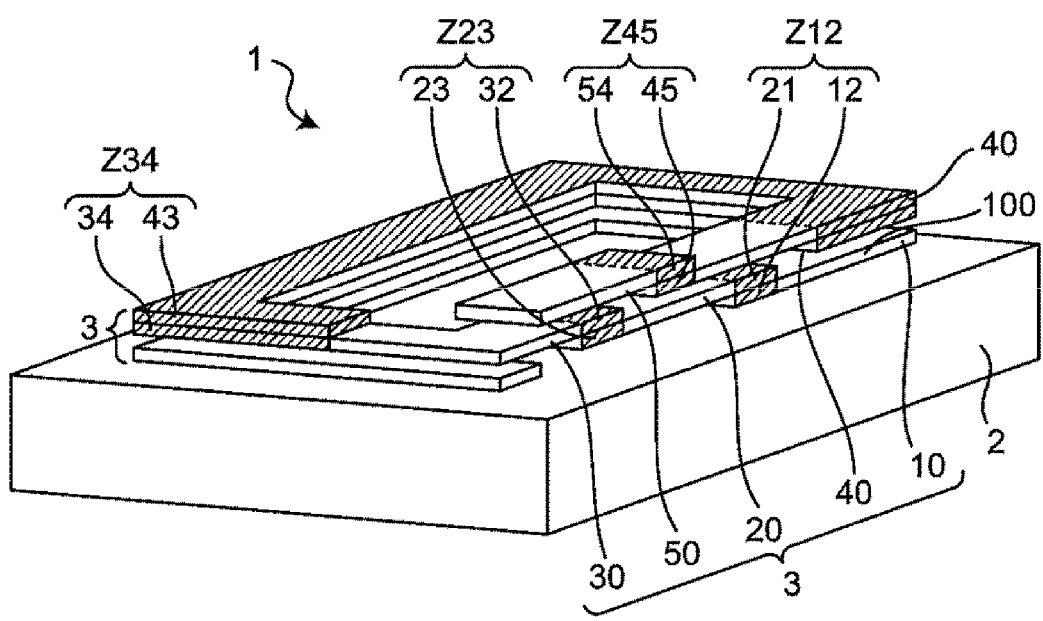
FIG. 2 is a partial schematic perspective view of the multilayer coil component.

FIG. 2 is a partial schematic perspective view of the multilayer coil component and is for explaining the inside of the element body 2A illustrated in FIG. 1. Therefore, in FIG. 2, for ease of understanding, only an element body 2, which is the part of the element body 2A that is located below the coil 3, is illustrated, and illustration of the first outer electrode 13a and the second outer electrode 13b in FIG. 1 is omitted.

In FIG. 2, the multilayer coil component 1 includes the element body 2, and the coil 3, which includes a plurality of coil conductors 10, 20, 30, 40, and 50 that are stacked in a stacking direction and are electrically connected to each other. The plurality of coil conductors 10 to 50 each include a contact portion that is a part of the coil conductor that contacts another coil conductor that is adjacent thereto in the stacking direction, and a non-contact portion that is a part of the coil conductor that does not contact another coil conductor that is adjacent thereto in the stacking direction.

For example, the first coil conductor 10 is provided with a contact portion 12, which is the part of the first coil conductor 10 that contacts the other second coil conductor 20 that is adjacent thereto in the stacking direction, and a non-contact portion 100, which is the part of the first coil conductor 10 that does not contact the second coil conductor 20 that is adjacent thereto in the stacking direction. Similarly, the coil conductor 20 includes a contact portion 21 that contacts the first coil conductor 10 that is adjacent to the coil conductor 20 in the stacking direction, and a contact portion 23 that contacts the third coil conductor 30 that is adjacent to the coil conductor 20 in the stacking direction. Similarly, the third coil conductor 30 has contact portions 32 and 34, the fourth coil conductor 40 has contact portions 43 and 45, and the fifth coil conductor 50 has a contact portion 54.

In addition, the contact portion 12 of the first coil conductor 10 and the contact portion 21, which contacts the first coil conductor 10, of the second coil conductor 20 form a contact region Z12. Similarly, each pair of contact portions that are adjacent to each other and contact each other in the stacking direction form one contact region. These contact regions are denoted as Z23, Z34, and Z45 in FIG. 2. In FIG. 2 and so forth, the areas corresponding to the contact portions and the contact regions are shaded with hatching.

In addition, the number of turns of the coil 3 is two and the number of coil conductor layers is five. The coil 3 is thus formed by stacking the first to fifth coil conductors 10 to 50. In addition, as illustrated in FIG. 2, all of the contact regions Z12, Z23, Z34, and Z45 are located at different positions when the coil 3 is viewed in the stacking direction. In other words, a plurality of contact regions are not arranged so as to overlap in the stacking direction at the same position when the coil 3 is viewed in the stacking direction. Furthermore, the number of turns n of the coil 3 is 2, and the number of coil conductor layers included in the coil 3 is given by 2n+1=5.

Thus, the length of the coil 3 can be made shorter, and therefore the direct-current resistance value of the multilayer coil component 1 can be reduced. In addition, the height of the coil 3 in the stacking direction can be reduced, and therefore a low profile can be realized for the multilayer coil component 1.

Hereafter, the multilayer coil component 1 will be described in detail.

The multilayer coil component 1 is electrically connected to wiring lines on a circuit board, which is not illustrated, via the first outer electrode 13a and the second outer electrode 13b. The multilayer coil component 1 is for example used as a noise-removing filter, and is used in an electronic appliance such as a personal computer, a DVD player, a digital camera, a TV, a cellular phone, or an in-car electronic appliance, for example.

The element body 2 is formed of magnetic layers, for example. The magnetic layers are ceramic layers for example, and the ceramic layers are composed of a magnetic substance such as ferrite. The element body 2 may be formed of non-magnetic layers instead of magnetic layers or may be partially formed of non-magnetic layers. Such non-magnetic layers are formed of a non-magnetic substance such as borosilicate glass or a ceramic filler.

The element body 2 is formed in a substantially rectangular parallelepiped shape. In FIG. 1, the surfaces of the element body 2 include a left end surface, a right end surface that faces the left end surface, an upper surface, a lower surface that faces the upper surface, a front surface, and a rear surface that faces the front surface.

In FIG. 2, for ease of understanding, only the element body 2 part that is located below the coil 3 is illustrated. The coil 3 includes the first coil conductor 10, the second coil conductor 20, the third coil conductor 30, the fourth coil conductor 40, and the fifth coil conductor 50. The first to fifth coil conductors 10 to 50 are vertically stacked in this order and are electrically connected to each other. Although not illustrated, magnetic layers (or non-magnetic layers) that form the element body 2 are arranged in the gaps between the first to fifth coil conductors 10 to 50.

One end of the coil 3 is connected to the first outer electrode 13a, and the other end of the coil 3 is connected to the second outer electrode 13b. More specifically, an end portion of the first coil conductor 10 is electrically connected to the first outer electrode 13a via a first extension conductor, which is not illustrated. An end portion of the fifth coil conductor 50 is electrically connected to the second outer electrode 13b via a second extension conductor, which is not illustrated.

As illustrated in FIG. 1, the first outer electrode 13a covers the entire left end surface of the element body 2 and part of each of the upper surface, the lower surface, the front surface, and the rear surface of the element body 2. As illustrated in FIG. 1, the second outer electrode 13b covers the entire right end surface of the element body 2 and part of each of the upper surface, the lower surface, the front surface, and the rear surface of the element body 2.

Next, the steps of stacking the first to fifth coil conductors 10 to 50 will be described.

Figure 3A:
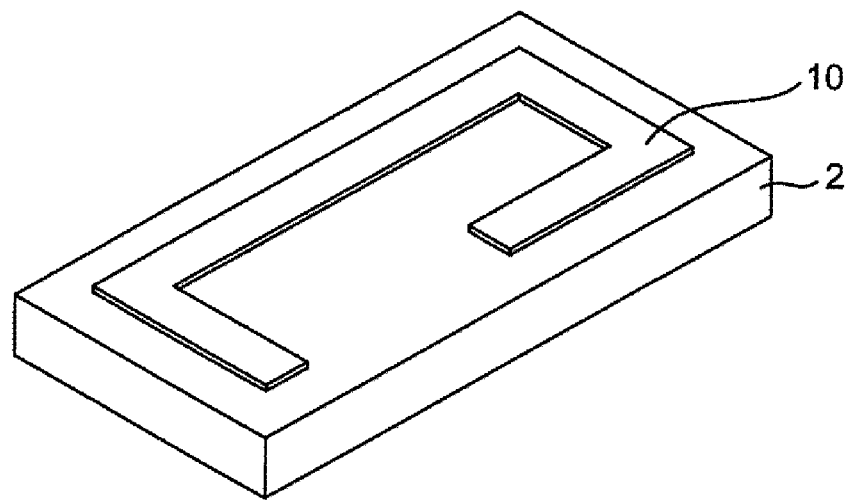
FIG. 3A is an explanatory diagram, which is seen from a diagonal direction, that is for explaining a step of stacking a coil conductor.

FIGS. 3A to 3E are explanatory diagrams, seen from a diagonal direction, that are for explaining the steps of stacking the coil conductors, and FIGS. 4A to 4E are explanatory diagrams, which are seen from above, that are for explaining the steps of stacking the coil conductors. FIG. 3A seen from a diagonal direction and FIG. 4A seen from above illustrate the same stacking step, and FIGS. 3B to 3E and FIGS. 4B to 4E have similar relationships with each other.

Figure 4A:
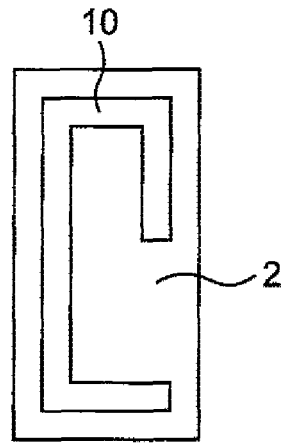
FIG. 4A is an explanatory diagram, which is seen from above, that is for explaining a step of stacking a coil conductor.

As illustrated in FIG. 3A and FIG. 4A, the first coil conductor 10 is stacked on a magnetic layer of the element body 2. The first coil conductor 10 includes a conductive material such as Ag or Cu, for example. The first coil conductor 10 is stacked using a method in which a paste including the conductive material is applied to the element body 2 and then dried. The second to fifth coil conductors 20 to 50 referred to below can be formed and stacked in the same way. The first coil conductor 10 extends through less than one complete turn, and has a pattern consisting of three corner portions and four side portions when viewed in the stacking direction.

Figure 3B:
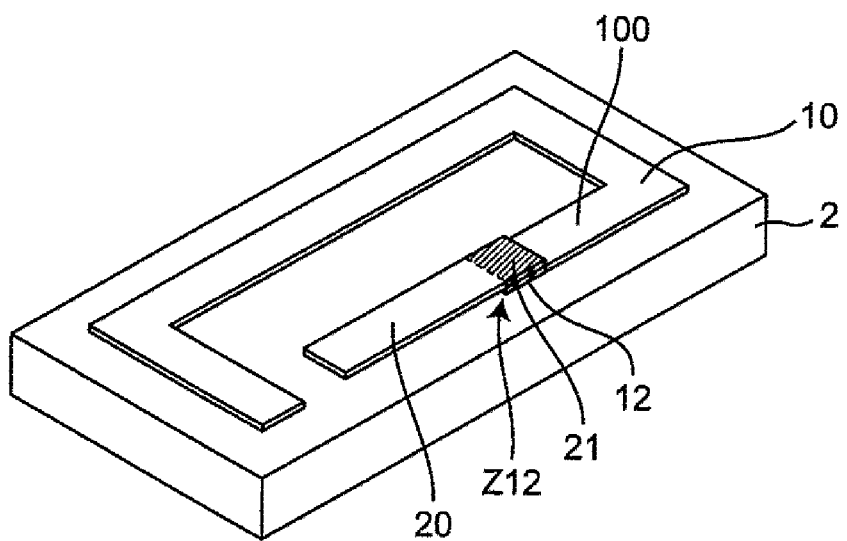
FIG. 3B is an explanatory diagram, which is seen from a diagonal direction, that is for explaining a step of stacking a coil conductor.
Figure 4B:
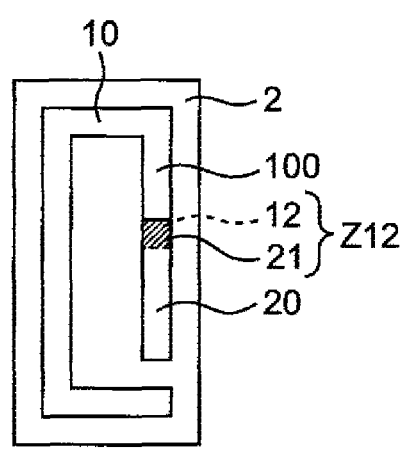
FIG. 4B is an explanatory diagram, which is seen from above, that is for explaining a step of stacking a coil conductor.

As illustrated in FIGS. 3B and 4B, the second coil conductor 20 is stacked on the first coil conductor 10 such that one end of the first coil conductor 10 and one end of the second coil conductor 20 overlap and contact each other. The first coil conductor 10 has the contact portion 12. The contact portion 12 is the part of the first coil conductor 10 that contacts the second coil conductor 20 that is adjacent thereto in the stacking direction. In addition, the first coil conductor 10 has the non-contact portion 100, which is the part of the first coil conductor 10 that does not contact the second coil conductor 20 that is adjacent thereto in the stacking direction.

The second coil conductor 20 has a substantially linearly shaped pattern when viewed in the stacking direction. The second coil conductor 20 has the contact portion 21. The contact portion 21 is the part of the second coil conductor 20 that contacts the first coil conductor 10 that is adjacent thereto in the stacking direction.

In addition, the pair of contact portions 12 and 21 that are adjacent to each other in the stacking direction and contact each other form the contact region Z12. The first coil conductor 10 and the second coil conductor 20 are stacked in the stacking direction and are electrically connected to each other via the respective contact portions 12 and 21 thereof.

Figure 3C:
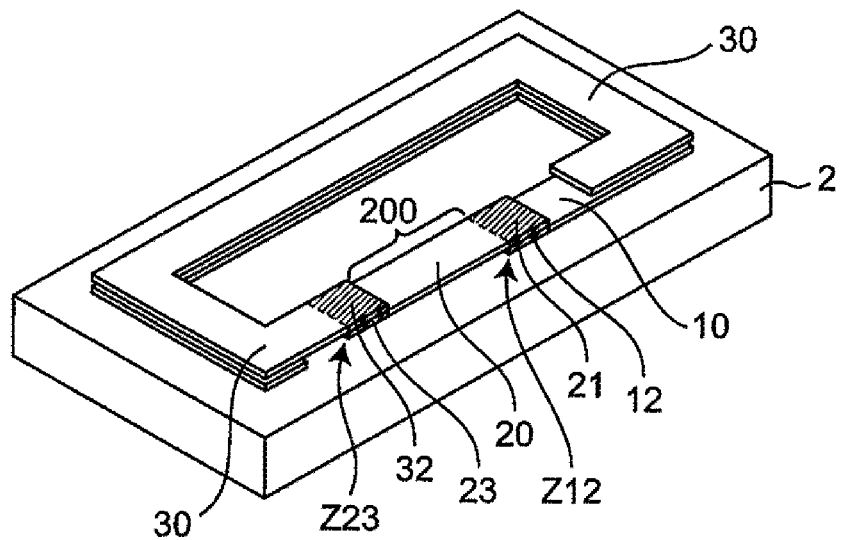
FIG. 3C is an explanatory diagram, which is seen from a diagonal direction, that is for explaining a step of stacking a coil conductor.
Figure 4C:
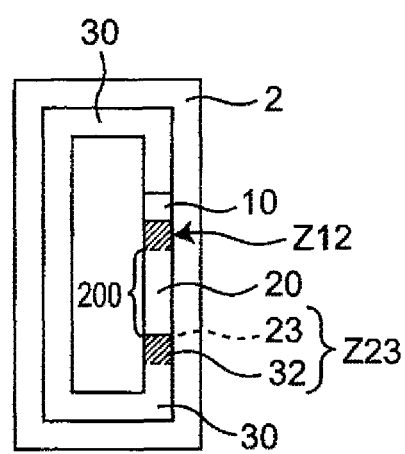
FIG. 4C is an explanatory diagram, which is seen from above, that is for explaining a step of stacking a coil conductor.

As illustrated in FIGS. 3C and 4C, the third coil conductor 30 is stacked on the second coil conductor 20 such that one end of the second coil conductor 20 and one end of the third coil conductor 30 overlap and contact each other. The second coil conductor 20 has the contact portion 23. The contact portion 23 is the part of the second coil conductor 20 that contacts the third coil conductor 30 that is adjacent to thereto in the stacking direction and the contact portion 23 is located at the opposite end of the second coil conductor 20 from the contact portion 21 that contacts the first coil conductor 10.

In addition, the second coil conductor 20 includes a non-contact portion 200. The non-contact portion 200 is the part of the second coil conductor 20 that does not contact the first coil conductor 10 that is adjacent thereto in the stacking direction and that does not contact the third coil conductor 30 that is adjacent thereto in the stacking direction.

The third coil conductor 30 extends through less than one complete turn, and has a pattern consisting of four corner portions and five side portions when viewed in the stacking direction. The third coil conductor 30 has the contact portion 32. The contact portion 32 is the part of the third coil conductor 30 that contacts the second coil conductor 20 that is adjacent thereto in the stacking direction.

In addition, the pair of contact portions 23 and 32 that are adjacent to each other in the stacking direction and contact each other form the contact region Z23. The second coil conductor 20 and the third coil conductor 30 are stacked in the stacking direction and are electrically connected to each other via the respective contact portions 23 and 32 thereof.

Figure 3D:
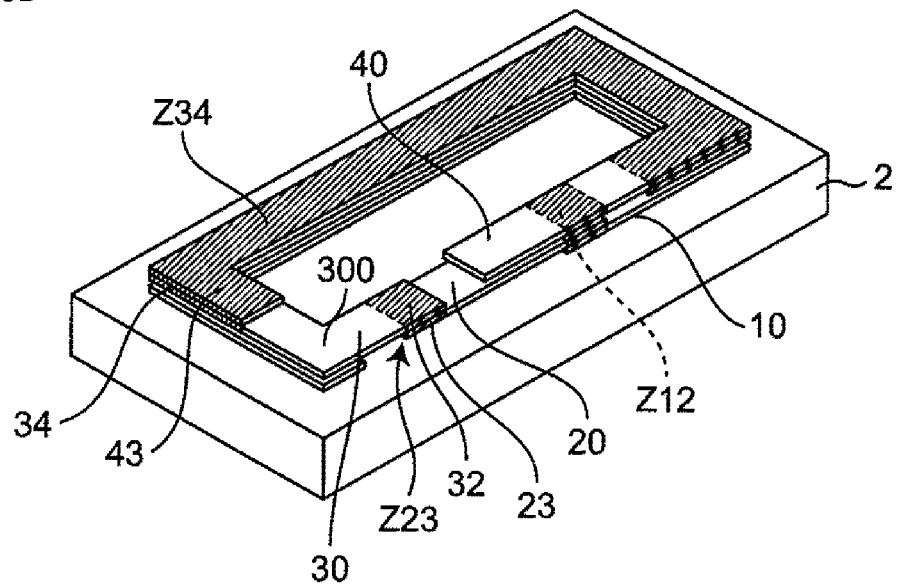
FIG. 3D is an explanatory diagram, which is seen from a diagonal direction, that is for explaining a step of stacking a coil conductor.
Figure 4D:
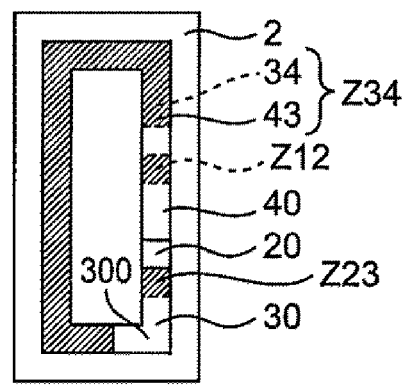
FIG. 4D is an explanatory diagram, which is seen from above, that is for explaining a step of stacking a coil conductor.

As illustrated in FIGS. 3D and 4D, the fourth coil conductor 40 is stacked on the third coil conductor 30 such that one end of the third coil conductor 30 and one end of the fourth coil conductor 40 overlap and contact each other. The third coil conductor 30 has the contact portion 34. The contact portion 34 is the part of the third coil conductor 30 that contacts the fourth coil conductor 40 that is adjacent thereto in the stacking direction and the contact portion 34 is located at the opposite end of the third coil conductor 30 from the contact portion 32 that contacts the second coil conductor 20.

In addition, the third coil conductor 30 includes a non-contact portion 300. The non-contact portion 300 is the part of the third coil conductor 30 that does not contact the second coil conductor 20 that is adjacent thereto in the stacking direction and that does not contact the fourth coil conductor 40 that is adjacent thereto in the stacking direction.

The fourth coil conductor 40 extends through less than one complete turn, and has a pattern consisting of three corner portions and four side portions when viewed in the stacking direction. The fourth coil conductor 40 has the contact portion 43. The contact portion 43 is the part of the fourth coil conductor 40 that contacts the third coil conductor 30 that is adjacent thereto in the stacking direction.

In addition, the pair of contact portions 34 and 43 that are adjacent to each other in the stacking direction and contact each other form the contact region Z34. The third coil conductor 30 and the fourth coil conductor 40 are stacked in the stacking direction and are electrically connected to each other via the respective contact portions 34 and 43 thereof.

Figure 3E:
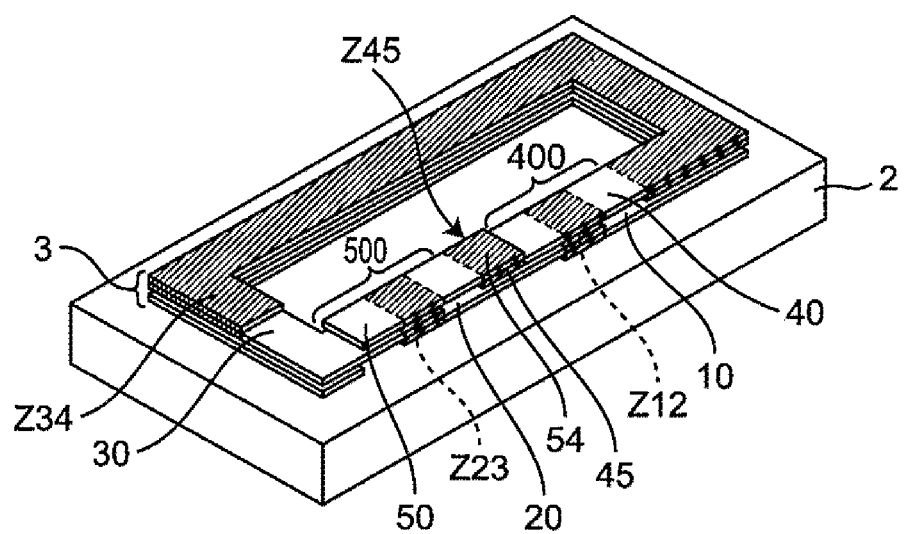
FIG. 3E is an explanatory diagram, which is seen from a diagonal direction, that is for explaining a step of a stacking coil conductor.
Figure 4E:
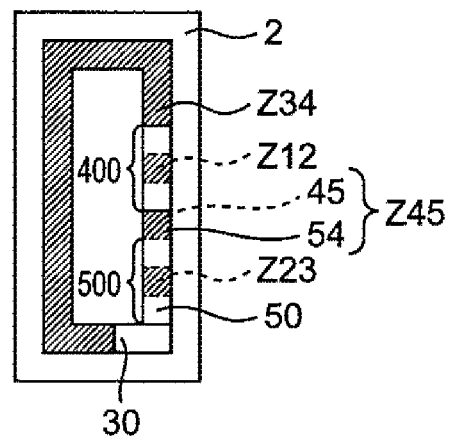
FIG. 4E is an explanatory diagram, which is seen from above, that is for explaining a step of stacking a coil conductor.

As illustrated in FIGS. 3E and 4E, the fifth coil conductor 50 is stacked on the fourth coil conductor 40 such that one end of the fourth coil conductor 40 and one end of the fifth coil conductor 50 overlap and contact each other. The fourth coil conductor 40 has the contact portion 45. The contact portion 45 is the part of the fourth coil conductor 40 that contacts the fifth coil conductor 50 that is adjacent thereto in the stacking direction and the contact portion 45 is located at the opposite end of the fourth coil conductor 40 from the contact portion 43 that contacts the third coil conductor 30.

In addition, the fourth coil conductor 40 includes a non-contact portion 400. The non-contact portion 400 is the part of the fourth coil conductor 40 that does not contact the third coil conductor 30 that is adjacent thereto in the stacking direction and that does not contact the fifth coil conductor 50 that is adjacent thereto in the stacking direction.

The fifth coil conductor 50 has a substantially linearly shaped pattern when viewed in the stacking direction. The fifth coil conductor 50 has the contact portion 54. The contact portion 54 is the part of the fifth coil conductor 50 that contacts the fourth coil conductor 40 that is adjacent thereto in the stacking direction.

In addition, the fifth coil conductor 50 has a non-contact portion 500. The non-contact portion 500 is the part of the fifth coil conductor 50 that does not contact the fourth coil conductor 40 that is adjacent thereto in the stacking direction.

In addition, the pair of contact portions 45 and 54 that are adjacent to each other in the stacking direction and contact each other form the contact region Z45. The fourth coil conductor 40 and the fifth coil conductor 50 are stacked in the stacking direction and are electrically connected to each other via the respective contact portions 45 and 54 thereof.

The coil 3 is thus formed by stacking the first to fifth coil conductors 10 to 50. In addition, as illustrated in FIG. 4E, all of the contact regions Z12, Z23, Z34, and Z45 are located at different positions when the coil 3 is viewed in the stacking direction. Furthermore, the number of turns n of the coil 3 is 2, and the number of coil conductor layers included in the coil 3 is given by 2n+1=5. Therefore, the length of the coil 3 can be reduced, and therefore the direct-current resistance value of the multilayer coil component can be reduced, and the height of the coil 3 in the stacking direction can be reduced, and therefore a low profile can be realized for the multilayer coil component 1.

In more detail, in the related art, it is necessary to arrange two layers of connection portions so as to overlap in the stacking direction, that is, to arrange two layers of parts corresponding to the connection regions in the embodiment of the present disclosure so as to overlap in the stacking direction, and in addition, it is necessary to arrange all of the coil portions (corresponding to coil conductors in the embodiment of the present disclosure) such that every two coil portion layers are stacked on top of each other. In other words, in the multilayer coil component of the related art, four coil portion layers and two connection portion layers, that is, a total of six coil-forming layers are necessary when the number of turns of the coil is 2, for example. Therefore, the number of coil-forming layers is increased and the coil length is increased in the related art.

In contrast, according to the multilayer coil component 1 of this embodiment of the present disclosure, a plurality of contact regions are not arranged so as to overlap in the stacking direction at the same position when viewed in the stacking direction, and the number of coil conductor layers included in the coil 3 given by 2n+1, where n is the number of turns of the coil 3. Therefore, a coil can be formed without it being necessary for every two layers of all the coil conductors, which have patterns having at least two side portions, to be stacked on top of each other.

Therefore, compared with the multilayer coil component of the related art, the coil length of the multilayer coil component 1 according to this embodiment can be reduced, and therefore the direct-current resistance value of the multilayer coil component 1 can be reduced. Additionally, since the number of stacked coil conductor layers of the coil 3 can be reduced, a low profile can be realized for the multilayer coil component 1 according to this embodiment.

Furthermore, according to the multilayer coil component 1 of this embodiment, a plurality of contact regions are not arranged so as to overlap in the stacking direction at the same position when viewed in the stacking direction, and therefore thick parts of the coil 3 are not concentrated in one place, and therefore the risk of short circuits, cracking, and so forth of the coil component, such as the coil conductors or the element body 2, can be avoided.

Although the following should not be interpreted as limiting the cause of the above problems to one specific theory, if thick parts of the coil 3 were concentrated in a single place, that is, if a plurality of the contact regions were arranged so as to overlap in the stacking direction, stress would be more likely to be generated due to the difference between the coefficients of linear expansion of the Ag included in coil conductors and the ferrite included in the element body 2, and the risk of the occurrence of cracking, short circuits, and so forth of the multilayer coil component would be high. However, in the case of the multilayer coil component 1 of this embodiment, such risks can be avoided.

For example, the number of turns n of the coil 3 may be a positive number between 1 and 4. The number of turns n of the coil 3 is preferably around 1, 2, or 3.

When the number of turns n of the coil 3 lies within this kind of range, the coil length of the multilayer coil component can be further reduced, and therefore the direct-current resistance value of the multilayer coil component can be made even smaller. In addition, as illustrated in FIG. 3D (FIG. 4D) and FIG. 3E (FIG. 4E), the length of the corresponding contact portion among the contact portions 12 to 54 of at least one coil conductor among the plurality of coil conductors 10 to 50 (that is, the length of the contact region Z12, Z23, Z34, or Z45) can be set as appropriate provided that all of the contact regions are located at different positions when viewed in the stacking direction, the number of turns n of the coil 3 is an arbitrary positive number, and the number of stacked coil conductor layers is given by 2n+1. Thus, the contact area between adjacent coil conductors can be increased, and therefore the direct-current resistance value can be further reduced.

In the present disclosure, the lengths of the contact portions 12 to 54 refer to the distances through which the contact portions 12 to 54 extend in the directions of extension of the coil conductors 10 to 50. For example, as illustrated in FIG. 4E, the lengths of the contact portions 12, 21, 23, 32, 45, and 54 of the coil conductors 10 to 50 are substantially the same as each other, and the lengths of the contact portions 34 and 43 are larger than the lengths of the other contact portions 12, 21, 23, 32, 45, and 54.

The shape of the coil 3 is not particularly limited and may be a rectangular shape, a circular shape, or an elliptical shape, for example. That is, the shapes of the coil conductors 10 to 50 can be selected as appropriate so long as all of the contact regions Z12 to Z45 are located at different positions when viewed in the stacking direction, the number of turns n of the coil is an arbitrary positive number, and the number of stacked coil conductor layers is given by 2n+1. Thus, design changes can be made to the shapes of the coil conductors 10 to 50 without degrading the characteristics of the coil 3.

In this case, "the shapes of the coil conductors 10 to 50" means the shapes of the coil conductors when viewed in the stacking direction. In addition, since the coil conductors 10 to 50 are each less than one complete turn, all of the contact region Z12 to Z45 can be arranged at different positions when viewed in the stacking direction.

It is preferable that end portions of the coil conductors 10 to 50 be located along the extension directions of the coil conductors. For example, it is preferable that the coil conductors 10 to 50 do not protrude into the inside of the coil.

A reduction in the inner diameter of the coil 3 can be suppressed by adopting this kind of shape for the end portions of the coil conductors 10 to 50, and therefore it is possible to further suppress reductions in the physical properties of the coil 3 such as the inductance of the coil 3. According to the first embodiment, the number of stacked coil conductor layers in the coil 3 can be reduced and the coil length can be reduced, and therefore the direct-current resistance value of the multilayer coil component 1 can be reduced. In addition, since there is no need for the coil 3 to include coil-forming layers that only include connection portions and the height of the coil 3 in the stacking direction can be reduced, a low profile can be realized for the multilayer coil component 1.

Second Embodiment

FIGS. 5A to 5E are explanatory diagrams, which are seen from above, that are for explaining steps of stacking coil conductors in a second embodiment. FIG. 6 is a schematic diagram of a coil 3a of a multilayer coil component of the second embodiment that is for explaining the connection relationships between a first coil conductor 10a, a second coil conductor 20a, a third coil conductor 30a, a fourth coil conductor 40a, and a fifth coil conductor 50a illustrated in FIGS. 5A to 5E, and in which the coil conductors 10a, 20a, 30a, 40a, and 50a have been extended out in a straight line.

The second embodiment differs from the first embodiment in terms of the shapes and so forth of the first to fifth coil conductors 10a to 50a of the coil 3a. These differences will be described below.

Hereafter, the description will focus on points that are different from the first embodiment. The rest of the configuration is the same as in the first embodiment, and parts that are the same as in the first embodiment are denoted by the same symbols and description thereof is omitted.

Figure 5A:
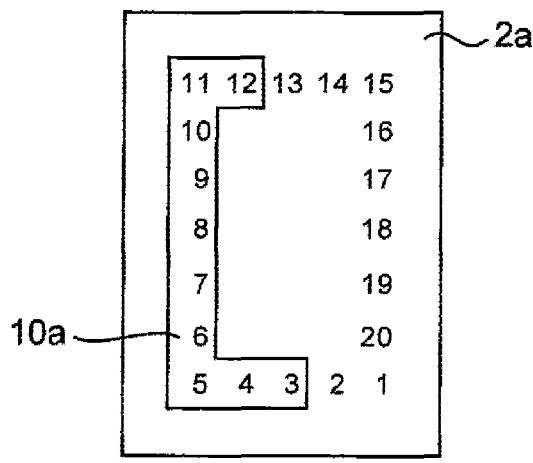
FIG. 5A is an explanatory diagram, which is seen from above, that is for explaining a step of stacking a coil conductor in a multilayer coil component of a second embodiment.
Figure 6:
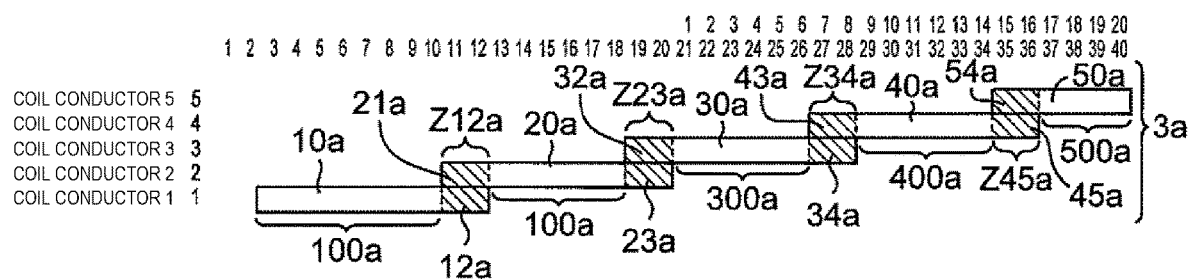
FIG. 6 is a schematic view of a coil of a multilayer coil component of a second embodiment in which a first to fifth coil conductors have been extended out into a straight line.

Pitch numbers in FIGS. 5A and 6 schematically indicate positions within coil conductors. Pitch numbers from 1 to 20 are written in FIG. 5A, and pitch numbers 1 to 40 are written in FIG. 6 with pitch numbers 1 to 20 appearing thereabove. The positions within a coil conductor at numbers illustrated in FIG. 5A and the positions within a coil conductor at numbers illustrated in FIG. 6 are the same.

In addition, the pitch numbers 1 to 40 correspond to two turns of the coil 3a. For example, the position indicated by pitch number 3 in FIG. 5A corresponds to the position of pitch number 3 and pitch number 23 in FIG. 6. In addition, in FIGS. 5A and 6, the pitch numbers 1 to 40 correspond to a case where the number of turns n of the coil 3a is 2.

As illustrated in FIGS. 5A and 6, the first coil conductor 10a is stacked on a magnetic layer of an element body 2a. The first coil conductor 10a extends through less than one complete turn, and has a pattern consisting of two corner portions and three side portions when viewed in the stacking direction.

Figure 5B:
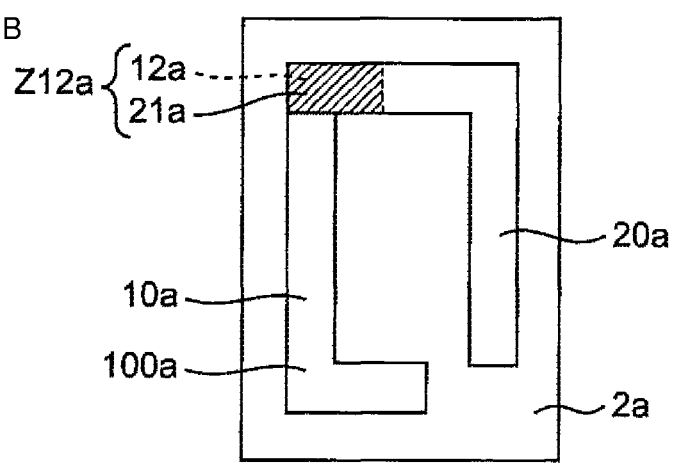
FIG. 5B is an explanatory diagram, which is seen from above, that is for explaining a step of stacking a coil conductor.

As illustrated in FIGS. 5B and 6, the second coil conductor 20a is stacked on the first coil conductor 10a such that one end of the first coil conductor 10a and one end of the second coil conductor 20a overlap and contact each other.

The first coil conductor 10a has a contact portion 12a. The contact portion 12a is the part of the first coil conductor 10a that contacts the second coil conductor 20a that is adjacent thereto in the stacking direction. In addition, the first coil conductor 10a has a substantially L-shaped non-contact portion 100a that does not contact the second coil conductor 20a that is adjacent thereto in the stacking direction.

The second coil conductor 20a extends through less than one complete turn, and has a pattern consisting of one corner portion and two side portions when viewed in the stacking direction. The second coil conductor 20a has a contact portion 21a. The contact portion 21a is the part of the second coil conductor 20a that contacts the first coil conductor 10a that is adjacent thereto in the stacking direction.

In addition, the pair of contact portions 12a and 21a that are adjacent to each other in the stacking direction and contact each other form a contact region Z12a. The first coil conductor 10a and the second coil conductor 20a are stacked in the stacking direction and are electrically connected to each other via the respective contact portions 12a and 21a thereof.

Figure 5C:
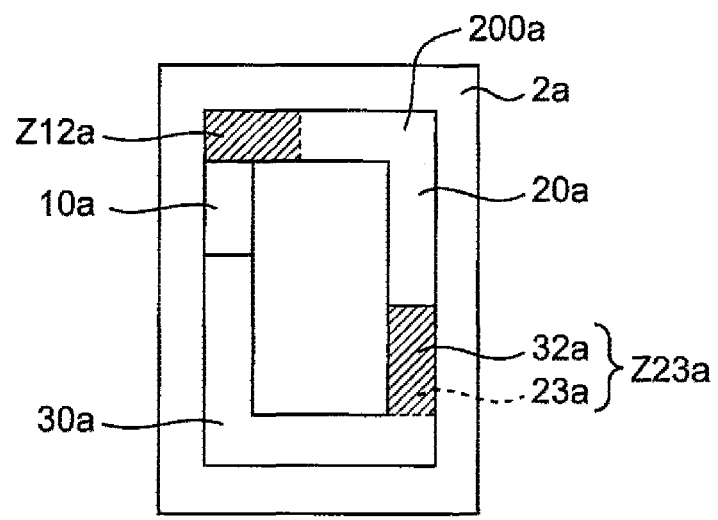
FIG. 5C is an explanatory diagram, which is seen from above, that is for explaining a step of stacking a coil conductor.

As illustrated in FIGS. 5C and 6, the third coil conductor 30a is stacked on the second coil conductor 20a such that one end of the second coil conductor 20a and one end of the third coil conductor 30a overlap and contact each other.

The second coil conductor 20a has a contact portion 23a. The contact portion 23a is the part of the second coil conductor 20a that contacts the third coil conductor 30a that is adjacent thereto in the stacking direction and the contact portion 23a is located at the opposite end of the second coil conductor 20a from the contact portion 21a that contacts the first coil conductor 10a.

In addition, the second coil conductor 20a includes a non-contact portion 200a. The non-contact portion 200a is the part of the second coil conductor 20a that does not contact the first coil conductor 10a that is adjacent thereto in the stacking direction and that does not contact the third coil conductor 30a that is adjacent thereto in the stacking direction.

The third coil conductor 30a extends through less than one complete turn, and has a pattern consisting of two corner portions and three side portions when viewed in the stacking direction. The third coil conductor 30a has a contact portion 32a. The contact portion 32a is the part of the third coil conductor 30a that contacts the second coil conductor 20a that is adjacent thereto in the stacking direction.

In addition, the pair of contact portions 23a and 32a that are adjacent to each other in the stacking direction and contact each other form a contact region Z23a. The second coil conductor 20a and the third coil conductor 30a are stacked in the stacking direction and are electrically connected to each other via the respective contact portions 23a and 32a thereof.

Figure 5D:
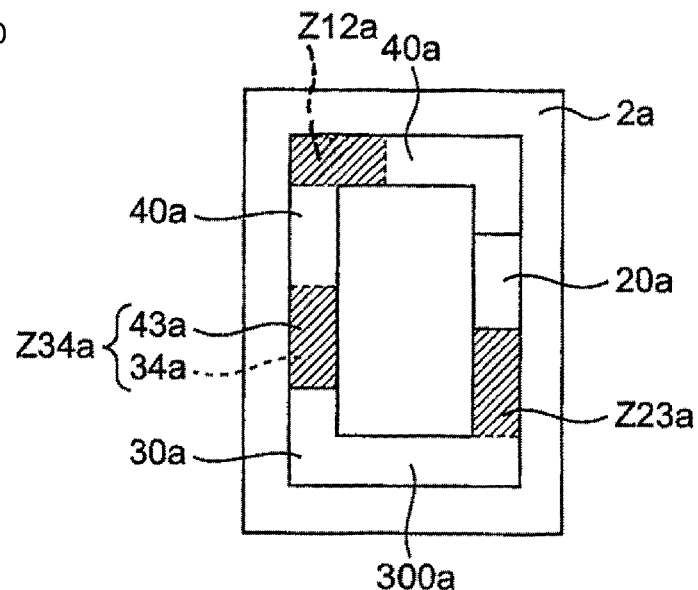
FIG. 5D is an explanatory diagram, which is seen from above, that is for explaining a step of stacking a coil conductor.

As illustrated in FIGS. 5D and 6, the fourth coil conductor 40a is stacked on the third coil conductor 30a such that one end of the third coil conductor 30a and one end of the fourth coil conductor 40a overlap and contact each other.

The third coil conductor 30a has a contact portion 34a. The contact portion 34a is the part of the third coil conductor 30a that contacts the fourth coil conductor 40a that is adjacent thereto in the stacking direction and the contact portion 34a is located at the opposite end of the third coil conductor 30a from the contact portion 32a that contacts the second coil conductor 20a.

In addition, the third coil conductor 30a includes a non-contact portion 300a. The non-contact portion 300a is the part of the third coil conductor 30a that does not contact the second coil conductor 20a that is adjacent thereto in the stacking direction and that does not contact the fourth coil conductor 40a that is adjacent thereto in the stacking direction.

The fourth coil conductor 40a extends through less than one complete turn, and has a pattern consisting of two corner portions and three side portions when viewed in the stacking direction. The fourth coil conductor 40a has a contact portion 43a. The contact portion 43a is the part of the fourth coil conductor 40a that contacts the third coil conductor 30a that is adjacent thereto in the stacking direction.

In addition, the pair of contact portions 34a and 43a that are adjacent to each other in the stacking direction and contact each other form a contact region Z34a. The third coil conductor 30a and the fourth coil conductor 40a are stacked in the stacking direction and are electrically connected to each other via the respective contact portions 34a and 43a thereof.

Figure 5E:
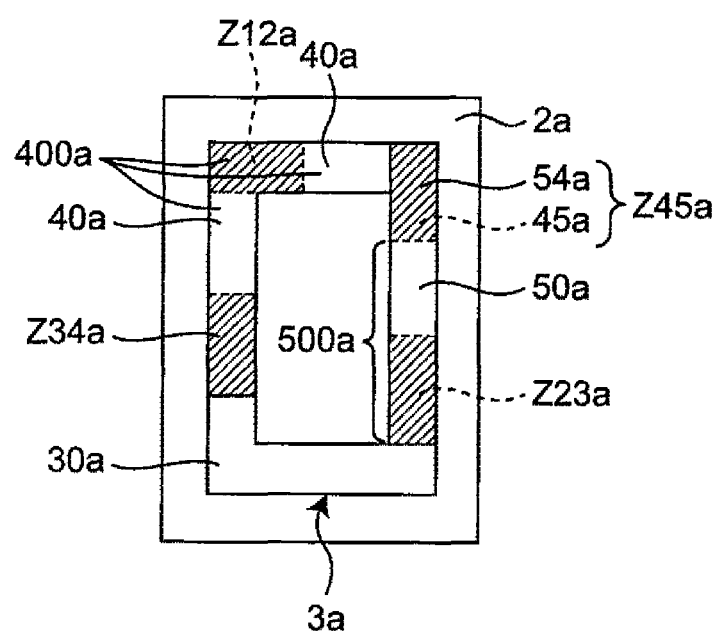
FIG. 5E is an explanatory diagram, which is seen from above, that is for explaining a step of stacking a coil conductor.

As illustrated in FIGS. 5E and 6, the fifth coil conductor 50a is stacked on the fourth coil conductor 40a such that one end of the fourth coil conductor 40a and one end of the fifth coil conductor 50a overlap and contact each other.

The fourth coil conductor 40a has a contact portion 45a. The contact portion 45a is the part of the fourth coil conductor 40a that contacts the fifth coil conductor 50a that is adjacent thereto in the stacking direction and the contact portion 45a is located at the opposite end of the fourth coil conductor 40a from the contact portion 43a that contacts the third coil conductor 30a.

In addition, the fourth coil conductor 40a includes a non-contact portion 400a. The non-contact portion 400a is the part of the fourth coil conductor 40a that does not contact the third coil conductor 30a that is adjacent thereto in the stacking direction and that does not contact the fifth coil conductor 50a that is adjacent thereto in the stacking direction.

The fifth coil conductor 50a has a substantially linearly shaped pattern when viewed in the stacking direction. The fifth coil conductor 50a has a contact portion 54a. The contact portion 54a is the part of the fifth coil conductor 50a that contacts the fourth coil conductor 40a that is adjacent thereto in the stacking direction.

The fifth coil conductor 50a has a non-contact portion 500a. The non-contact portion 500a is the part of the fifth coil conductor 50a that does not contact the fourth coil conductor 40a that is adjacent thereto in the stacking direction.

In addition, the pair of contact portions 45a and 54a that are adjacent to each other in the stacking direction and contact each other form a contact region Z45a. The fourth coil conductor 40a and the fifth coil conductor 50a are stacked in the stacking direction and are electrically connected to each other via the respective contact portions 45a and 54a thereof.

As illustrated in FIG. 6, the number of turns n of the coil 3a is 2, and the number of coil conductor layers included in the coil 3a is given by 2n+1=5. In addition, as illustrated in FIGS. 5E and 6, all of the contact regions Z12a, Z23a, Z34a, and Z45a are located at different positions from each other when viewed in the stacking direction. In other words, a plurality of contact regions are not arranged so as to overlap in the stacking direction at the same position when viewed in the stacking direction, and therefore the height of the coil 3a in the stacking direction can be reduced. Therefore, the height of the coil in the stacking direction can be reduced and a lower profile can be realized for the multilayer coil component compared with the multilayer coil component of the related art. Furthermore, as illustrated in FIGS. 5E and 6, the lengths of the contact regions Z12a, Z23a, Z34a, and Z45a are substantially the same as each other.

As illustrated in FIGS. 5A to 5E, the coil conductors 10a, 20a, 30a, 40a, and 50a have different shapes from each other when the coil 3a is viewed in the stacking direction. Thus, design changes can be made to the shapes of the coil conductors without degrading the characteristics of the coil 3a. As illustrated in FIGS. 5A to 5E, the coil 3a has a substantially rectangular shape when viewed in the stacking direction, and for example, has a substantially oblong shape when viewed in the stacking direction.

According to the second embodiment, the number of stacked coil conductor layers in the coil 3a can be reduced and the coil length can be reduced, and therefore the direct-current resistance value of the multilayer coil component can be reduced. In addition, the height of the coil 3a in the stacking direction can be reduced, and therefore a low profile can be realized for the multilayer coil component. In addition, design changes can be made to the shapes of the coil conductors without degrading the characteristics of the coil 3a.

Third Embodiment

FIGS. 7A to 7E are explanatory diagrams, which are seen from above, that are for explaining steps of stacking coil conductors in a third embodiment. FIG. 8 is a schematic diagram of a coil 3b of a multilayer coil component of the third embodiment that is for explaining the connection relationships between first to fifth coil conductors 10b to 50b illustrated in FIGS. 7A to 7E and in which the first to fifth coil conductors 10b to 50b have been extended out into a straight line.

The third embodiment differs from the first embodiment and the second embodiment in terms of the shapes of the first to fifth coil conductors 10b to 50b of the coil 3b. In addition, the thickness of a non-contact portion 100b of the first coil conductor 10b is larger than the thicknesses of non-contact portions 200b to 500b of the second to fifth coil conductors 20b to 50b. In addition, the length of a contact region Z34b is larger than the length of the non-contact portion 300b and the length of the non-contact portion 400b. These differences will be described below.

Hereafter, the description will focus on points that are different from the first embodiment and the second embodiment. The rest of the configuration is the same as in the first embodiment and the second embodiment, and parts that are the same as in the first embodiment and the second embodiment are denoted by the same symbols and description thereof is omitted.

Figure 7A:
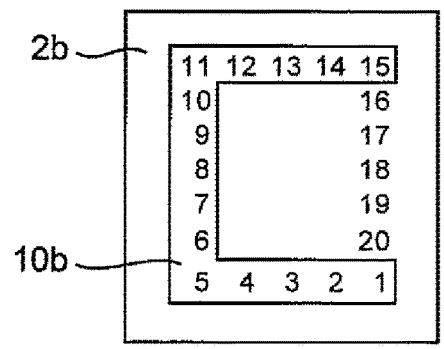
FIG. 7A is an explanatory diagram, which is seen from above, that is for explaining a step of stacking a coil conductor in a multilayer coil component of a third embodiment.
Figure 7B:
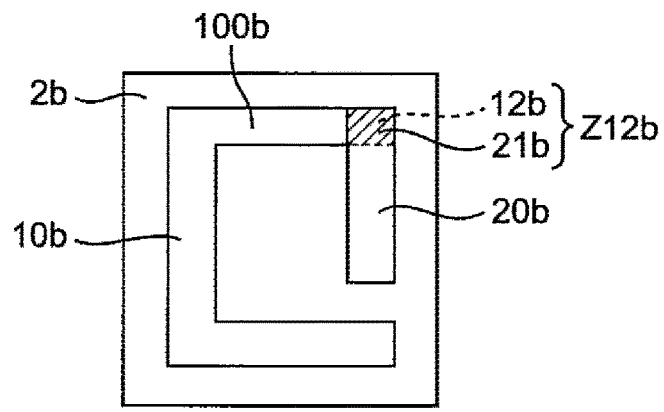
FIG. 7B is an explanatory diagram, which is seen from above, that is for explaining a step of stacking a coil conductor.
Figure 8:
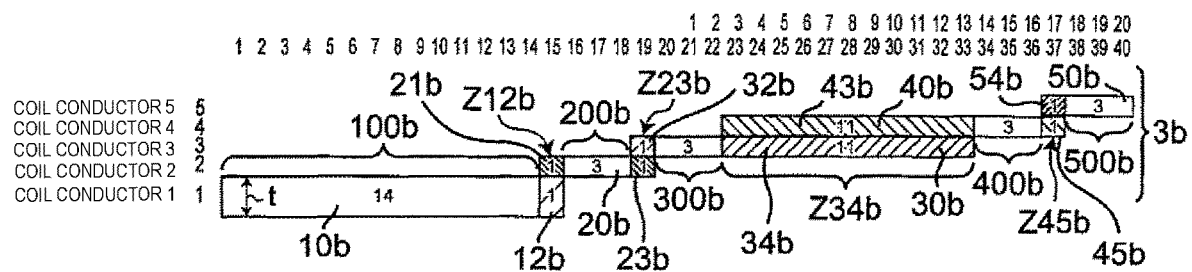
FIG. 8 is a schematic view of a coil of a multilayer coil component of a third embodiment in which first to fifth coil conductors have been extended out into a straight line.

In FIG. 7A as well, numbers 1 to 20 are written inside the coil pattern, and pitch numbers 1 to 40 are written in FIG. 8 with pitch numbers 1 to 20 appearing thereabove. The positions within a coil conductor at numbers illustrated in FIG. 7A and the positions within a coil conductor at numbers illustrated in FIG. 8 are the same. In addition, the pitch numbers 1 to 40 correspond to two turns of the coil 3b. As illustrated in FIG. 7A, the first coil conductor 10b is stacked on a magnetic layer of an element body 2b. The first coil conductor 10b extends through less than one complete turn, and has a pattern consisting of two corner portions and three side portions when viewed in the stacking direction. As illustrated in FIG. 7B, the second coil conductor 20b is stacked on the first coil conductor 10b such that one end of the first coil conductor 10b and one end of the second coil conductor 20b overlap and contact each other.

The first coil conductor 10b has a contact portion 12b. The contact portion 12b is the part of the first coil conductor 10b that contacts the second coil conductor 20b that is adjacent thereto in the stacking direction. In addition, the first coil conductor 10b has the non-contact portion 100b. The non-contact portion 100b is the part of the first coil conductor 10b that does not contact the second coil conductor 20b that is adjacent thereto in the stacking direction.

The second coil conductor 20b has a substantially linearly shaped pattern when viewed in the stacking direction. The second coil conductor 20b has a contact portion 21b. The contact portion 21b is the part of the second coil conductor 20b that contacts the first coil conductor 10b that is adjacent thereto in the stacking direction.

In addition, the pair of contact portions 12b and 21b that are adjacent to each other in the stacking direction and contact each other form a contact region Z12b. In other words, the first coil conductor 10b and the second coil conductor 20b are stacked in the stacking direction and are electrically connected to each other via the respective contact portions 12b and 21b thereof.

Figure 7C:
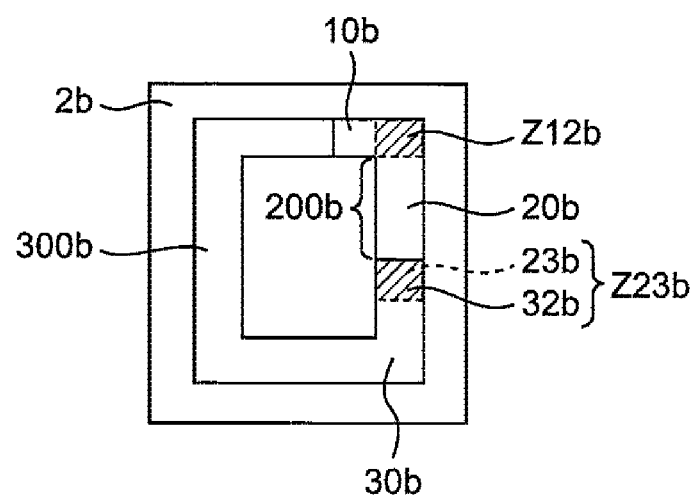
FIG. 7C is an explanatory diagram, which is seen from above, that is for explaining a step of stacking a coil conductor.

As illustrated in FIG. 7C, the third coil conductor 30b is stacked on the second coil conductor 20b such that one end of the second coil conductor 20b and one end of the third coil conductor 30b overlap and contact each other. The second coil conductor 20b has a contact portion 23b. The contact portion 23b is the part of the second coil conductor 20b that contacts the third coil conductor 30b that is adjacent to thereto in the stacking direction and the contact portion 23b is located at the opposite end of the second coil conductor 20b from the contact portion 21b that contacts the first coil conductor 10b.

In addition, the second coil conductor 20b includes the non-contact portion 200b. The non-contact portion 200b is the part of the second coil conductor 20b that does not contact the first coil conductor 10b that is adjacent thereto in the stacking direction and that does not contact the third coil conductor 30b that is adjacent thereto in the stacking direction.

The third coil conductor 30b extends through less than one complete turn, and has a pattern consisting of three corner portions and four side portions when viewed in the stacking direction. The third coil conductor 30b has a contact portion 32b. The contact portion 32b is the part of the third coil conductor 30b that contacts the second coil conductor 20b that is adjacent thereto in the stacking direction.

In addition, the pair of contact portions 23b and 32b that are adjacent to each other in the stacking direction and contact each other form a contact region Z23b. In other words, the second coil conductor 20b and the third coil conductor 30b are stacked in the stacking direction and are electrically connected to each other via the respective contact portions 23b and 32b thereof.

Figure 7D:
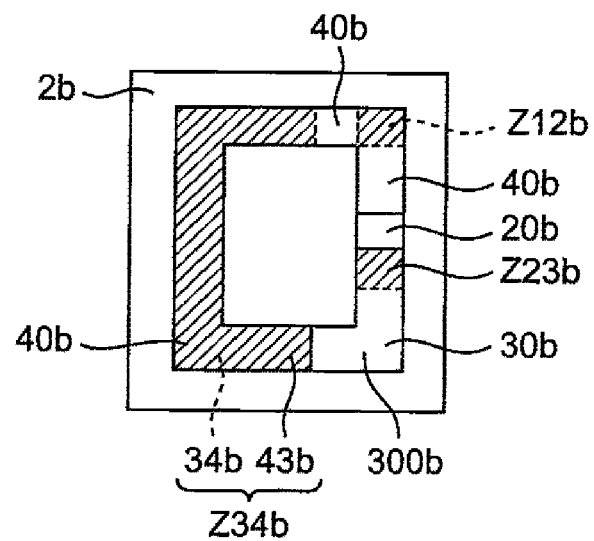
FIG. 7D is an explanatory diagram, which is seen from above, that is for explaining a step of stacking a coil conductor.

As illustrated in FIG. 7D, the fourth coil conductor 40b is stacked on the third coil conductor 30b such that one end of the third coil conductor 30b and one end of the fourth coil conductor 40b overlap and contact each other. The third coil conductor 30b has a contact portion 34b. The contact portion 34b is the part of the third coil conductor 30b that contacts the fourth coil conductor 40*b* that is adjacent to thereto in the stacking direction and the contact portion 34*b* is located at the opposite end of the third coil conductor 30*b* from the contact portion 32*b* that contacts the second coil conductor 20*b*.

In addition, the third coil conductor 30*b* includes the non-contact portion 300*b*. The non-contact portion 300*b* is the part of the third coil conductor 30*b* that does not contact the second coil conductor 20*b* that is adjacent thereto in the stacking direction and that does not contact the fourth coil conductor 40*b* that is adjacent thereto in the stacking direction.

The fourth coil conductor 40*b* extends through less than one complete turn, and has a pattern consisting of three corner portions and four side portions when viewed in the stacking direction. The fourth coil conductor 40*b* has a contact portion 43*b*. The contact portion 43*b* is the part of the fourth coil conductor 40*b* that contacts the third coil conductor 30*b* that is adjacent thereto in the stacking direction.

In addition, the pair of contact portions 34*b* and 43*b* that are adjacent to each other in the stacking direction and contact each other form a contact region Z34*b*. In other words, the third coil conductor 30*b* and the fourth coil conductor 40*b* are stacked in the stacking direction and are electrically connected to each other via the respective contact portions 34*b* and 43*b* thereof.

Figure 7E:
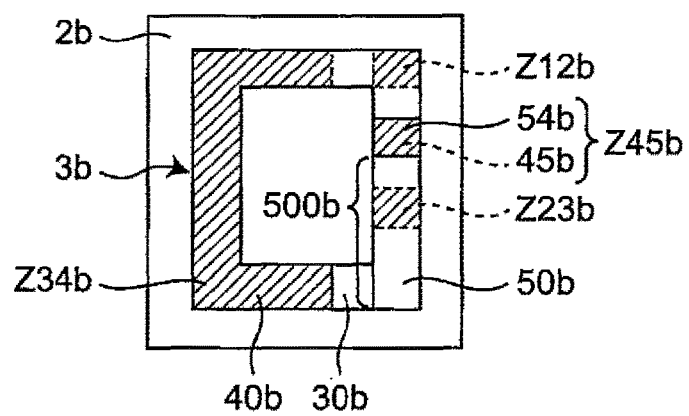
FIG. 7E is an explanatory diagram, which is seen from above, that is for explaining a step of stacking a coil conductor.

As illustrated in FIG. 7E, the fifth coil conductor 50*b* is stacked on the fourth coil conductor 40*b* such that one end of the fourth coil conductor 40*b* and one end of the fifth coil conductor 50*b* overlap and contact each other. The fourth coil conductor 40*b* has a contact portion 45*b*. The contact portion 45*b* is the part of the fourth coil conductor 40*b* that contacts the fifth coil conductor 50*b* that is adjacent to thereto in the stacking direction and the contact portion 45*b* is located at the opposite end of the fourth coil conductor 40*b* from the contact portion 43*b* that contacts the third coil conductor 30*b*.

In addition, the fourth coil conductor 40*b* includes the non-contact portion 400*b*. The non-contact portion 400*b* is the part of the fourth coil conductor 40*b* that does not contact the third coil conductor 30*b* that is adjacent thereto in the stacking direction and that does not contact the fifth coil conductor 50*b* that is adjacent thereto in the stacking direction.

The fifth coil conductor 50*b* has a substantially linearly shaped pattern when viewed in the stacking direction. The fifth coil conductor 50*b* has a contact portion 54*b*. The contact portion 54*b* is the part of the fifth coil conductor 50*b* that contacts the fourth coil conductor 40*b* that is adjacent thereto in the stacking direction.

In addition, the fifth coil conductor 50*b* has the non-contact portion 500*b*. The non-contact portion 500*b* is the part of the fifth coil conductor 50*b* that does not contact the fourth coil conductor 40*b* that is adjacent thereto in the stacking direction. In addition, the pair of contact portions 45*b* and 54*b* that are adjacent to each other in the stacking direction and contact each other form a contact region Z45*b*. In other words, the fourth coil conductor 40*b* and the fifth coil conductor 50*b* are stacked in the stacking direction and are electrically connected to each other via the respective contact portions 45*b* and 54*b* thereof.

As illustrated in FIG. 8, the number of turns n of the coil 3*b* is 2, and the number of stacked coil conductor layers included in the coil 3*b* is 5. In addition, as illustrated in FIGS. 7E and 8, all of the contact regions Z12*b*, Z23*b*, Z34*b*, and Z45*b* are located at different positions from each other when viewed in the stacking direction. In other words, a plurality of contact regions are not arranged so as to overlap in the stacking direction at the same position when viewed in the stacking direction, and therefore the height of the coil 3*b* in the stacking direction can be reduced. Therefore, the height in the stacking direction can be reduced, and consequently a low profile can be realized for the multilayer coil component.

In this case, as illustrated in FIG. 8, the numbers illustrated inside the contact regions Z12*b*, Z23*b*, Z34*b*, and Z45*b* of the coil 3*b* are values schematically representing the lengths of the contact portions 12*b* to 54*b*, that is, the lengths of the contact regions Z12*b*, Z23*b*, Z34*b*, and Z45*b*. For example, the number "1" written inside the contact portion 12*b* and the contact portion 21*b* included in the contact region Z12*b* is a value that schematically represents the length of the contact portions 12*b* and 21*b*.

In addition, the numbers written in the parts corresponding to the non-contact portions 100*b* to 500*b* are values that schematically represent the lengths of the non-contact portions 100*b* to 500*b*. For example, the number 14 written inside the non-contact portion 100*b* is a value that schematically represents the fact that the length of the non-contact portion 100*b* of the first coil conductor 10*b* is 14. The numbers written inside the coil conductors are conceptual values and the values do not represent lengths that are actually implemented.

As illustrated in FIG. 8, the thickness (t) of the non-contact portion 100*b* of at least one first coil conductor 10*b* among the plurality of coil conductors 10*b* to 50*b* is larger than the thicknesses of the non-contact portions 200*b* to 500*b* of the other coil conductors 20*b* to 50*b*. Thus, the cross-sectional area of at least one coil conductor, that is, the first coil conductor 10*b* can be increased and the direct-current resistance value of the coil can be reduced.

For example, the thickness of the non-contact portion of at least one coil conductor among the plurality of coil conductors is around 1.2-2.8 times and preferably around 1.5-2.5 times the thickness of the non-contact portions of the other coil conductors. As a result, the cross-sectional area of the at least one coil conductor can be increased, and therefore the direct-current resistance value of the coil can be reduced.

A non-contact portion thickness ratio is a ratio between the coil conductor having the non-contact portion having the largest thickness and the coil conductor having the non-contact portion having the smallest thickness among the plurality of coil conductors 10*b* to 50*b*. In addition, the coil 3*b* may have a coil conductor in which the thickness of the non-contact portion thereof has an intermediate value between the thickness of the non-contact portion having the smallest thickness and the thickness of the non-contact portion having the largest thickness.

At least one coil conductor among the plurality of coil conductors 10*b* to 50*b*, for example, the third coil conductor 30*b*, has the contact portion 34*b* that has a longer length than the non-contact portion 300*b*. As a result, the contact area with the adjacent coil conductor, that is, the fourth coil conductor 40*b* can be increased, and therefore the direct-current resistance value can be reduced.

In addition, the fourth coil conductor 40*b* has the contact portion 43*b* that has a longer length than the non-contact portion 400*b*. As a result, the contact area with the adjacent coil conductor, that is, the third coil conductor 30*b* can be increased, and therefore the direct-current resistance value can be reduced. In other words, the length of the contact region Z34*b* is longer than the lengths of the non-contact portions 300b and 400b and the contact area between the coil conductors 30b and 40b that are adjacent to each other in the stacking direction can be increased, and therefore the direct-current resistance value of the coil 3b can be reduced.

As illustrated in FIGS. 7A to 7E, the coil 3b has a substantially rectangular shape when viewed in the stacking direction, and for example, has a substantially oblong shape when viewed in the stacking direction. According to the third embodiment, the number of stacked coil conductor layers in the coil 3b can be reduced and the coil length can be reduced, and therefore the direct-current resistance value of the multilayer coil component can be reduced.

In addition, the height of the coil 3b in the stacking direction of the coil 3b can be reduced, and therefore a low profile can be realized for the multilayer coil component. In addition, the contact area between adjacent coil conductors can be increased, and therefore the direct-current resistance value can be further reduced.

Fourth Embodiment

FIGS. 9A to 9E are explanatory diagrams, which are seen from above, that are for explaining steps of stacking coil conductors in a fourth embodiment. In addition, FIGS. 10A to 10E are schematic diagrams that illustrate the shapes of coil conductors 10c, 20c, 30c, 40c, and 50c exemplified in the fourth embodiment.

The fourth embodiment differs from the first embodiment, the second embodiment, and the third embodiment in terms of the shapes of first to fifth coil conductors 10c to 50c of a coil 3c. The fourth embodiment also differs in the following ways, for example. The width of a non-contact portion, when viewed in the stacking direction, of at least one coil conductor among the plurality of coil conductors 10c to 50c is larger than the width of the contact portion of the coil conductor.

The coil 3c has a substantially rectangular shape when viewed in the stacking direction, and the respective non-contact portions of a plurality of coil conductors are located on one side of the coil when the coil is viewed in the stacking direction. The coil has a substantially rectangular shape when viewed in the stacking direction, and the respective non-contact portions of a plurality of coil conductors are located on a short side of the coil when the coil is viewed in the stacking direction.

These differences will be described below.

Hereafter the description will focus on points that are different from the first embodiment, the second embodiment, and the third embodiment. The rest of the configuration is the same as in the first embodiment, the second embodiment, and the third embodiment, and parts that are the same as in the first embodiment, the second embodiment, and the third embodiment are denoted by the same symbols and description thereof is omitted.

Figure 9A:
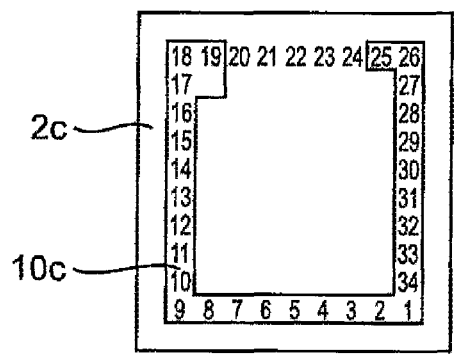
FIG. 9A is an explanatory diagram, which is seen from above, that is for explaining a step of stacking a coil conductor in a multilayer coil component of a fourth embodiment.

In this case, as illustrated in FIG. 9A, numbers 1 to 34 are written in order to explain a coil pitch of the coil conductors 10c to 50c. That is, one turn of the coil is represented by pitch numbers 1 to 34.

Figure 10A:
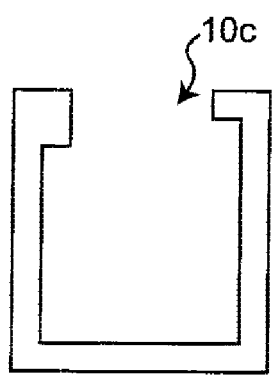
FIG. 10A is a schematic diagram illustrating the shape of a coil conductor exemplified in a multilayer coil component of a fourth embodiment.

As illustrated in FIG. 9A, the first coil conductor 10c is stacked on a magnetic layer of an element body 2c. As illustrated in FIGS. 9A and 10A, the first coil conductor 10c extends through less than one complete turn, and has a pattern consisting of four corner portions and five side portions when viewed in the stacking direction. In addition, the width of one end (pitch number 19 side) of the first coil conductor 10c when viewed in the stacking direction is larger than the width of the other end (pitch number 25 side) of the first coil conductor 10c.

"One end" refers to one end of one coil conductor in the length direction of the coil and "the other end" refers to the other end of the coil that is at the opposite end of the coil in the length direction of the coil. In addition, the "width" of a coil conductor refers to a dimension of the coil conductor in a direction that is perpendicular to the direction in which the coil conductor extends when viewed in the stacking direction.

Figure 9B:
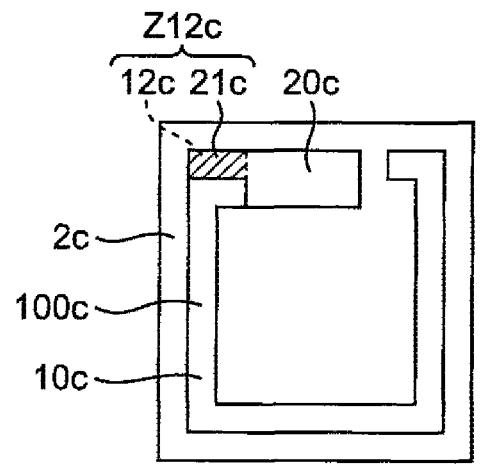
FIG. 9B is an explanatory diagram, which is seen from above, that is for explaining a step of stacking a coil conductor.

As illustrated in FIG. 9B, the second coil conductor 20c is stacked on the first coil conductor 10c such that one end of the first coil conductor 10c and one end of the second coil conductor 20c overlap and contact each other. The first coil conductor 10c has a contact portion 12c. The contact portion 12c is the part of the first coil conductor 10c that contacts the second coil conductor 20c that is adjacent thereto in the stacking direction. In addition, the first coil conductor 10c has a non-contact portion 100c. The non-contact portion 100c is the part of the first coil conductor 10c that does not contact the second coil conductor 20c that is adjacent thereto in the stacking direction.

Figure 10B:
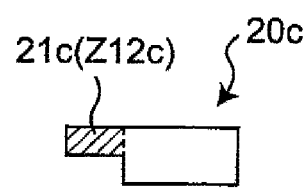
FIG. 10B is a schematic diagram illustrating the shape of a coil conductor.

As illustrated in FIGS. 9B and 10B, the second coil conductor 20c has a shape in which the width of one end thereof (pitch number 18 side) is smaller than the width of the other end thereof (pitch number 23 side) when viewed in the stacking direction. The second coil conductor 20c has a contact portion 21c. The contact portion 21c is the part of the second coil conductor 20c that contacts the first coil conductor 10c that is adjacent thereto in the stacking direction.

In addition, the pair of contact portions 12c and 21c that are adjacent to each other in the stacking direction and contact each other form a contact region Z12c. In other words, the first coil conductor 10c and the second coil conductor 20c are stacked in the stacking direction and are electrically connected to each other via the respective contact portions 12c and 21c thereof.

Figure 9C:
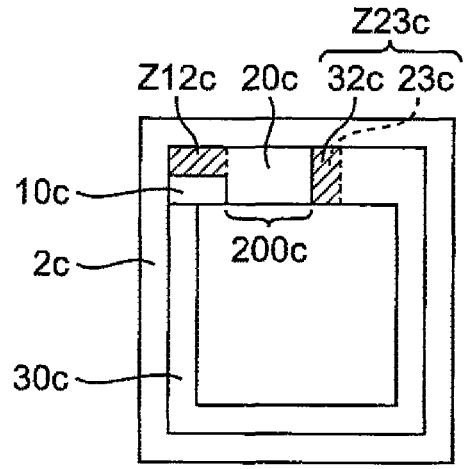
FIG. 9C is an explanatory diagram, which is seen from above, that is for explaining a step of stacking a coil conductor.

As illustrated in FIG. 9C, the third coil conductor 30c is stacked on the second coil conductor 20c such that one end of the second coil conductor 20c and one end of the third coil conductor 30c overlap and contact each other. The second coil conductor 20c has a contact portion 23c. The contact portion 23c is the part of the second coil conductor 20c that contacts the third coil conductor 30c that is adjacent to thereto in the stacking direction and the contact portion 23c is located at the opposite end of the second coil conductor 20c from the contact portion 21c that contacts the first coil conductor 10c.

In addition, the second coil conductor 20c includes a non-contact portion 200c. The non-contact portion 200c is the part of the second coil conductor 20c that does not contact the first coil conductor 10c that is adjacent thereto in the stacking direction and that does not contact the third coil conductor 30c that is adjacent thereto in the stacking direction.

In this case, the width of the non-contact portion 200c of the second coil conductor 20c is larger than the width of the contact portion 21c (that is, the contact region Z12c). As a result, the cross-sectional area of the coil conductor in the non-contact portion 200c can be increased, and therefore the direct-current resistance value can be reduced.

Figure 10C:
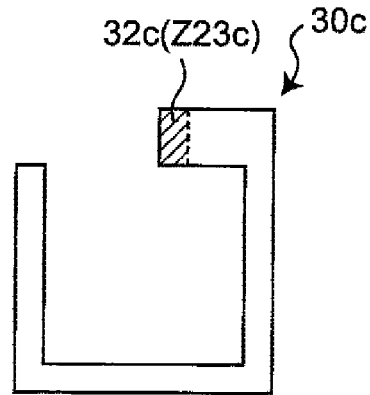
FIG. 10C is a schematic diagram illustrating the shape of a coil conductor.

As illustrated in FIGS. 9C and 10C, the third coil conductor 30c extends through less than one complete turn, and has a pattern consisting of three corner portions and four side portions when viewed in the stacking direction. In addition, when viewed in the stacking direction, the third coil conductor 30c has a shape in which the width of one end (pitch number 23 side) of the third coil conductor 30c is larger than the width of the other end (pitch number 16 side) of the third coil conductor 30c.

The third coil conductor 30c has a contact portion 32c. The contact portion 32c is the part of the third coil conductor 30c that contacts the second coil conductor 20c that is adjacent thereto in the stacking direction.

In addition, the pair of contact portions 23c and 32c that are adjacent to each other in the stacking direction and contact each other form a contact region Z23c. In other words, the second coil conductor 20c and the third coil conductor 30c are stacked in the stacking direction and are electrically connected to each other via the respective contact portions 23c and 32c thereof.

Figure 9D:
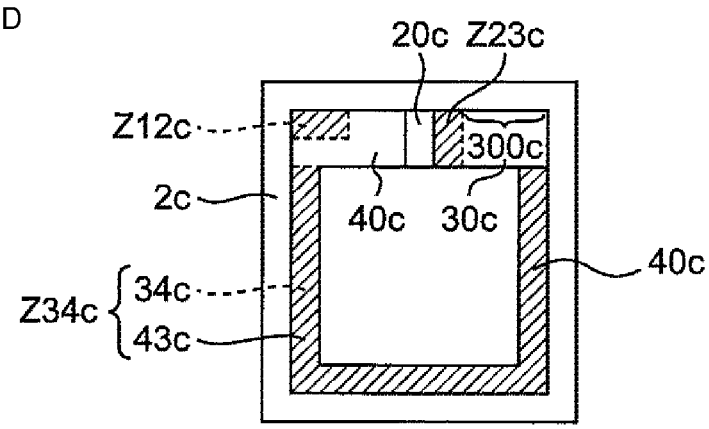
FIG. 9D is an explanatory diagram, which is seen from above, that is for explaining a step of stacking a coil conductor.

As illustrated in FIG. 9D, the fourth coil conductor 40c is stacked on the third coil conductor 30c such that one end of the third coil conductor 30c and one end of the fourth coil conductor 40c overlap and contact each other. The third coil conductor 30c has a contact portion 34c. The contact portion 34c is the part of the third coil conductor 30c that contacts the fourth coil conductor 40c that is adjacent to thereto in the stacking direction and the contact portion 34c is located at the opposite end of the third coil conductor 30c from the contact portion 32c that contacts the second coil conductor 20c.

In addition, the third coil conductor 30c includes a non-contact portion 300c. The non-contact portion 300c is the part of the third coil conductor 30c that does not contact the second coil conductor 20c that is adjacent thereto in the stacking direction and that does not contact the fourth coil conductor 40c that is adjacent thereto in the stacking direction.

In this case, the width of the non-contact portion 300c of the third coil conductor 30c is larger than the width of the contact portion 34c (that is, a contact region Z34c). As a result, the cross-sectional area of the coil conductor in the non-contact portion 300c can be increased, and therefore the direct-current resistance value can be reduced.

Figure 10D:
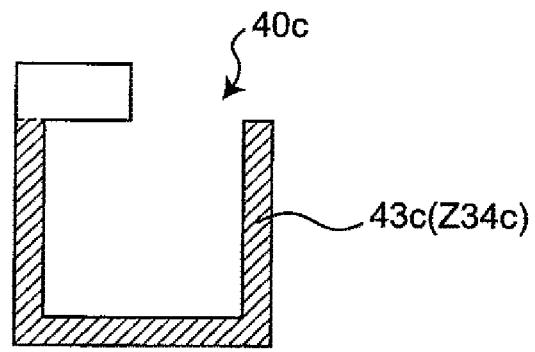
FIG. 10D is a schematic diagram illustrating the shape of a coil conductor.

As illustrated in FIGS. 9D and 10D, the fourth coil conductor 40c extends through less than one complete turn, and has a pattern consisting of two corner portions and three side portions when viewed in the stacking direction. In addition, the fourth coil conductor 40c has a shape in which the width of one end (pitch number 21 side) of the fourth coil conductor 40c is larger than the width of the other end (pitch number 28 side) of the fourth coil conductor 40c when viewed in the stacking direction.

The fourth coil conductor 40c has a contact portion 43c. The contact portion 43c is the part of the fourth coil conductor 40c that contacts the third coil conductor 30c that is adjacent thereto in the stacking direction.

In addition, the pair of contact portions 34c and 43c that are adjacent to each other in the stacking direction and contact each other form the contact region Z34c. In other words, the third coil conductor 30c and the fourth coil conductor 40c are stacked in the stacking direction and are electrically connected to each other via the respective contact portions 34c and 43c thereof.

Figure 9E:
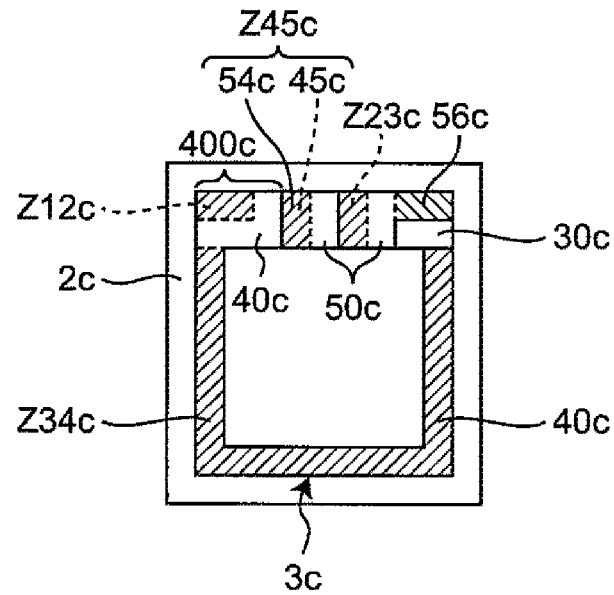
FIG. 9E is an explanatory diagram, which is seen from above, that is for explaining a step of stacking a coil conductor.

As illustrated in FIG. 9E, the fifth coil conductor 50c is stacked on the fourth coil conductor 40c such that one end of the fourth coil conductor 40c and one end of the fifth coil conductor 50c overlap and contact each other. The fourth coil conductor 40c has a contact portion 45c. The contact portion 45c is the part of the fourth coil conductor 40c that contacts the fifth coil conductor 50c that is adjacent to thereto in the stacking direction and the contact portion 45c is located at the opposite end of the fourth coil conductor 40c from the contact portion 43c that contacts the third coil conductor 30c.

In addition, the fourth coil conductor 40c includes a non-contact portion 400c. The non-contact portion 400c is the part of the fourth coil conductor 40c that does not contact the third coil conductor 30c that is adjacent thereto in the stacking direction and that does not contact the fifth coil conductor 50c that is adjacent thereto in the stacking direction.

In this case, as illustrated in FIG. 9E, the width of the non-contact portion 400c of the fourth coil conductor 40c is larger than the width of the contact portion 43c (that is, a contact region Z43c). As a result, the cross-sectional area of the coil conductor in the non-contact portion 400c can be increased, and therefore the direct-current resistance value can be reduced.

Figure 10E:
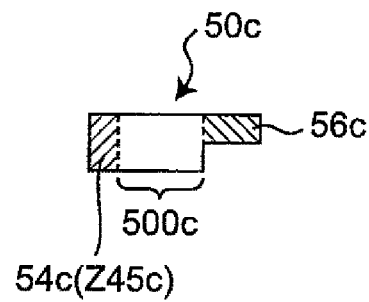
FIG. 10E is a schematic diagram illustrating the shape of a coil conductor.

As illustrated in FIGS. 9E and 10E, the fifth coil conductor 50c has a shape in which the width of one end thereof (pitch number 21 side) is larger than the width of the other end thereof (pitch number 26 side) when viewed in the stacking direction. The fifth coil conductor 50c has a contact portion 54c. The contact portion 54c is the part of the fifth coil conductor 50c that contacts the fourth coil conductor 40c that is adjacent thereto in the stacking direction. In addition, the fifth coil conductor 50c has a contact portion 56c. The contact portion 56c is the part of the fifth coil conductor 50c that contacts a sixth coil conductor (not illustrated) that is adjacent to thereto in the stacking direction and the contact portion 56c is located at the opposite end of the fifth coil conductor 50c from the contact portion 54c that contacts the fourth coil conductor 40c.

In addition, the fifth coil conductor 50c includes a non-contact portion 500c. The non-contact portion 500c is the part of the fifth coil conductor 50c that does not contact the fourth coil conductor 40c that is adjacent thereto in the stacking direction and that does not contact the sixth coil conductor that is adjacent thereto in the stacking direction.

In addition, the pair of contact portions 45c and 54c that are adjacent to each other in the stacking direction and contact each other form a contact region Z45c. In other words, the fourth coil conductor 40c and the fifth coil conductor 50c are stacked in the stacking direction and are electrically connected to each other via the respective contact portions 45c and 54c thereof.

In this case, in the fifth coil conductor 50c, the width of the non-contact portion 500c is larger than the width of the contact portion 56c. As a result, the cross-sectional area of the coil conductor in the non-contact portion 500c can be increased, and therefore the direct-current resistance value can be reduced.

In addition, as illustrated in FIG. 9E, all of the contact regions Z12c, Z23c, Z34c, and Z45c and the contact portion 56c (that is, a contact region Z56c) are located at different positions when viewed in the stacking direction. In other words, a plurality of contact regions are not arranged so as to overlap in the stacking direction at the same position when viewed in the stacking direction, and therefore the height of the coil 3c in the stacking direction can be reduced. Therefore, the height in the stacking direction can be reduced, and consequently a low profile can be realized for the multilayer coil component.

As illustrated in FIGS. 9A to 9E, the coil 3c has a substantially rectangular shape when viewed in the stacking direction, and for example, has a substantially oblong shape when viewed in the stacking direction. As illustrated in FIGS. 9C to 9E, the respective non-contact portions of a plurality of coil conductors, for example, the large-width non-contact portions 200c, 300c, 400c, and 500c are located on one side of the coil when the coil is viewed in the stacking direction. In other words, the non-contact portions 200c, 300c, 400c, and 500c are arranged at positions corresponding to pitch numbers 18 to 26, and as a result, the large-width non-contact portions can be arranged so as to be concentrated along one side of the coil, and the inductance (L) can be further improved without reducing the surface area of the inner diameter part of the coil.

Thus, in at least one coil conductor among the plurality of coil conductor 10c to 50c, the width of at least one non-contact portion out of the non-contact portions 100c to 500c as viewed in the stacking direction is larger than the width of the contact portions when viewed in the stacking direction. As a result, the cross-sectional area of the coil conductor in the non-contact portion can be increased, and therefore the direct-current resistance value can be reduced.

For example, in at least one coil conductor among the plurality of coil conductors 10c to 50c, the width of at least one non-contact portion among the non-contact portions 100c to 500c when viewed in the stacking direction is around 1.2-2.8 times the width of the contact portions 12c to 56c, and is preferably around 1.5-2.5 times the width of the contact portions 12c to 56c. A ratio between the width of a non-contact portion and the width of a contact portion is the ratio between the coil conductor width in the largest-width part of the non-contact portion and the coil conductor width in the smallest-width part of the contact portion in at least one coil conductor among the plurality of coil conductors 10c to 50c.

In addition, in at least one coil conductor, the width may be small in at least part of the contact portion and the width may be large in at least part of the non-contact portion. Furthermore, the coil 3c has a substantially rectangular shape when viewed in the stacking direction, and the respective non-contact portions 200c, 300c, 400c, and 500c of the plurality of coil conductors may be arranged on a short side of the coil when viewed in the stacking direction. As a result, the inner-diameter part of the coil is substantially square shaped or close to a square shape when viewed in the stacking direction, and therefore the inductance can be further improved.

According to the third embodiment, the number of stacked coil conductor layers in the coil 3b can be reduced and the coil length can be reduced, and therefore the direct-current resistance value of the multilayer coil component can be reduced. In addition, the height of the coil 3b in the stacking direction of the coil 3b can be reduced, and therefore a low profile can be realized for the multilayer coil component. In addition, the contact area between adjacent coil conductors can be increased, and therefore the direct-current resistance value can be further reduced.

According to the fourth embodiment, since the coil length and the number of stacked coil conductor layers can be reduced, the direct-current resistance value of the multilayer coil component can be reduced, and the height in the stacking direction can be reduced and a low profile can be realized. In addition, a situation in which many coil conductors overlap at the same position when viewed in the stacking direction can be suppressed, and therefore a case where a conductor becomes very thick in one place due to many coil conductors overlapping at the same position can be avoided. Thus, an even lower profile can be realized for the multilayer coil component.

In addition, the cross-sectional area of at least one coil conductor can be increased, and therefore the direct-current resistance value can be further reduced. Furthermore, the large-width non-contact portions can be arranged so as to be concentrated on one side of the coil and the shape of the coil in the inner diameter direction becomes substantially square shaped or close to a square shape when viewed in the stacking direction, and therefore the inductance can be further improved.

The present disclosure is not limited to the above-described embodiments and design changes can be made within a range that does not depart from the gist of the present disclosure. For example, the characteristic features of the first to fourth embodiments may be combined with each other in various ways.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A multilayer coil component comprising:
   an element body; and
   a coil that is provided inside the element body and includes a plurality of coil conductors that are stacked in a stacking direction and are electrically connected to each other;
   wherein
   the coil conductors each have
      a contact portion that is a part of the coil conductor that contacts another coil conductor that is adjacent thereto in the stacking direction, and
      a non-contact portion that is a part of the coil conductor that does not contact another coil conductor that is adjacent thereto in the stacking direction,
   the respective contact portions of the coil conductors that are adjacent to each other in the stacking direction contact each other and are connected to each other,
   contact regions, which are formed as a result of the contact portions contacting each other, are all located at different positions from each other when viewed in the stacking direction, and
   n, which is a positive number, represents a number of turns of the coil, and a number of stacked layers of the coil conductors is given by 2n+1.

2. The multilayer coil component according to claim 1, wherein a thickness of the non-contact portion of at least one coil conductor among the plurality of coil conductors is larger than a thickness of the non-contact portion of another coil conductor.

3. The multilayer coil component according to claim 1, wherein, in at least one coil conductor among the plurality of coil conductors, a length of the contact portion is larger than a length of the non-contact portion.

4. The multilayer coil component according to claim 1, wherein, in at least one coil conductor among the plurality of coil conductors, a width of the non-contact portion is larger than a width of the contact portion.

5. The multilayer coil component according to claim 4, wherein
   the coil has a substantially rectangular shape when viewed in the stacking direction, and
   the respective non-contact portions of the plurality of coil conductors are positioned at one side of the coil when the coil is viewed in the stacking direction.

6. The multilayer coil component according to claim 5, wherein the coil has a substantially rectangular shape when viewed in the stacking direction, and the respective non-contact portions of the plurality of coil conductors are positioned at a short side of the coil when the coil is viewed in the stacking direction.

7. The multilayer coil component according to claim 1, wherein the plurality of coil conductors have different shapes from each other.

8. The multilayer coil component according to claim 1, wherein the number of turns n of the coil conductors is 2.

9. The multilayer coil component according to claim 2, wherein, in at least one coil conductor among the plurality of coil conductors, a length of the contact portion is larger than a length of the non-contact portion.

10. The multilayer coil component according to claim 2, wherein, in at least one coil conductor among the plurality of coil conductors, a width of the non-contact portion is larger than a width of the contact portion.

11. The multilayer coil component according to claim 3, wherein, in at least one coil conductor among the plurality of coil conductors, a width of the non-contact portion is larger than a width of the contact portion.

12. The multilayer coil component according to claim 2, wherein the plurality of coil conductors have different shapes from each other.

13. The multilayer coil component according to claim 3, wherein the plurality of coil conductors have different shapes from each other.

14. The multilayer coil component according to claim 4, wherein the plurality of coil conductors have different shapes from each other.

15. The multilayer coil component according to claim 5, wherein the plurality of coil conductors have different shapes from each other.

16. The multilayer coil component according to claim 6, wherein the plurality of coil conductors have different shapes from each other.

17. The multilayer coil component according to claim 2, wherein the number of turns n of the coil conductors is 2.

18. The multilayer coil component according to claim 3, wherein the number of turns n of the coil conductors is 2.

19. The multilayer coil component according to claim 4, wherein the number of turns n of the coil conductors is 2.

20. The multilayer coil component according to claim 5, wherein the number of turns n of the coil conductors is 2.

* * * * *